US010388874B2

(12) United States Patent
Rivnay et al.

(10) Patent No.: US 10,388,874 B2
(45) Date of Patent: Aug. 20, 2019

(54) ELECTROCHEMICAL DEVICE WITH SELF-ALIGNED INSULATION

(71) Applicant: Palo Alto Research Center Incorporated, Palo Alto, CA (US)

(72) Inventors: Jonathan Rivnay, Chicago, IL (US); Ping Mei, San Jose, CA (US); Brent S. Krusor, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 161 days.

(21) Appl. No.: 15/474,177

(22) Filed: Mar. 30, 2017

(65) Prior Publication Data
US 2018/0284059 A1    Oct. 4, 2018

(51) Int. Cl.
| | | |
|---|---|---|
| *H01L 21/768* | (2006.01) | |
| *H01L 51/00* | (2006.01) | |
| *H01L 51/05* | (2006.01) | |
| *H01L 51/10* | (2006.01) | |
| *H01L 21/02* | (2006.01) | |

(52) U.S. Cl.
CPC ........ *H01L 51/0021* (2013.01); *H01L 21/022* (2013.01); *H01L 21/76832* (2013.01); *H01L 21/76897* (2013.01); *H01L 51/0023* (2013.01); *H01L 51/0558* (2013.01); *H01L 51/102* (2013.01)

(58) Field of Classification Search
CPC . H01L 21/02109; H01L 21/64; H01L 21/702; H01L 21/782
See application file for complete search history.

(56) References Cited

U.S. PATENT DOCUMENTS 3,360,398 A    12/1967  Garibotti
5,539,174 A     7/1996  Rostoker

OTHER PUBLICATIONS

Giovannitti, et al., "Controlling the mode of operation of organic transistors through side-chain engineering", Proc. Natl. Acad. Sci. USA Oct. 25, 2016; 113(43): 12017-12022 Published online Oct. 10, 2016 doi: 10.1073/pnas.1608780113 Applied Physical Sciences.
Khodagholy, D. et al., "High transconductance organic electrochemical transistors", Nat. Commun. 4:2133 doi: 10.1038/ncomms3133 (2013).
Khodagholy, D. et al., "High speed and high density organic electrochemical transistor arrays", Appl. Phys. Lett. 99, 163304 (2011); doi: 10.1063/1.3652912.
Zhang, S., et al., "Water stability and orthogonal patterning of flexible micro-electrochemical transistors on plastic", *J. Mater. Chem. C*, 2016, 4, 1382-1385; doi: 10.1039/C5TC03664J.
Rivnay, et al., "High-performance transistors for bioelectronics through tuning of channel thickness", Science Advances 1(4) May 2015; doi: 10.1126/sciadv.1400251.

*Primary Examiner* — Cheung Lee
(74) *Attorney, Agent, or Firm* — Fay Sharpe LLP

(57) ABSTRACT

Electronic devices having two or more conductive contacts or terminals and methods of making the same. Including having a conducting interconnect line coated with an insulator stack (functionalized to be hydrophobic), cut—simultaneously allowing for one step, self-aligned, patterning of formed conducting contacts and the insulation stack. The combination of the cut in the insulation, along with the low surface energy of the insulating surface allow for active material to be deposited at the cut site defining the channel.

18 Claims, 4 Drawing Sheets

ELECTROCHEMICAL DEVICE WITH SELF-ALIGNED INSULATION

BACKGROUND

The present application is directed to the electronic fabrication arts.

Electronic devices having two or more conducting contacts (e.g., terminals) such as but not limited to transistors and resistive sensors (chemiresistors, thermistors, etc.) based on active materials (e.g., active inks) are useful for numerous applications including applications in health and environmental monitoring, and asset monitoring, among many other areas. Existing fabrication processes require numerous steps in order to pattern interconnects and conducting contacts (e.g., terminals, electrodes), the active material, and the insulation required to passivate elements of the electronic devices from the operation environment, from the fabrication environment and/or from other elements of the device.

FIGS. 1 and 2 depict known processes for the fabrication of electronic devices having two or more conducting contacts (terminals). More particularly FIG. 1 illustrates portions of a process for the fabrication of an Organic Electrochemical Transistor (OECT) at micron scale reproducibly using photolithography and dry lift off to pattern the active channel and insulator. See: Khodagholy, D et al., High Speed and High Density Organic Electrochemical Transistor Arrays, Applied Phys. Lett. 99, 163304 (2001); doi: 10.1063/1.3652912; and Khodagholy, D. et al., High Transconductance Organic Electrochemical Transistors, Nat. Commun. 4:2133 doi: 10.1038/ncomms3133 (2013), and FIG. 2 illustrates portions of an alternative process which employs photolithographic patterning of the active channel using orthogonal (perflourinated) resists. See: Zhang, S., et al., Water Stability and Orthogonal Patterning of Flexible Micro-electrochemical Transistors on Plastic. J. Mater. Chem. C, 2016, 4, 1382-1385; doi: 10.1039/C5TC03664J JMC C, 2014.

Returning to fabrication process 100 of FIG. 1, a first step 110 provides a substrate 112, and a patterned (e.g., photolithography) conductive layer 114, having a channel opening 116. In step 120 the process deposits two layers of a covering material (e.g., Parylene-C, "PaC") 122, 124 separated by an antiadhesive 126. In step 130, patterning (e.g., by photolithography) is used to etch both layers 132. Thereafter in step 140 the process includes spin casting an active material (e.g., poly polystyrene sulfonate) into the channel 116 (see step 110), and onto the surface areas 142. Finally, in step 150, a dry peel operation is undertaken to dry peel off material to define active material and the opening in the insulator 152.

Returning to fabrication process 200 of FIG. 2, in step 210 a substrate 212 is provided, and a conductive layer 214 is photolithographically patterned to create a channel 216. In step 220 active channel material (e.g., PEDOT:PSS) is spin cast 222 including into the channel. Thereafter in step 230 patterning (e.g. photolithographic operation) and liftoff of the PEDOT:PSS for orthogonal resist is undertaken 232. Next in step 240 spin cast orthogonal resist is provided as an insulating layer 242. Finally, in step 250 patterning (e.g. photolithographic) of the orthogonal resist is performed 252.

In the approaches illustrated in FIGS. 1 and 2, tolerance for alignment of subsequent photolithographic steps means significant unwanted overlap of features producing unwanted performance degrading parasitic capacitance. These approaches also require two or more photolithographic steps to define the micron scale dimensions of the channel length, width, and opening in the insulator.

It is considered useful to provide a streamlined fabrication process for the manufacture of electronic devices having two or more conducting contacts (e.g., terminals), which also reduce parasitic capacitance of the fabricated device.

BRIEF DESCRIPTION

A method of manufacturing an electronic device includes, providing a substrate; depositing a conductive material on at least a portion of the substrate, to form a conducting interconnect line; coating at least the conducting interconnect line of the deposited conductive material with an insulation stack, wherein the insulation stack consists of an insulation layer and a hydrophobic layer; in a single operational step, forming a channel in the insulation stack and the conducting interconnect line to form distinct conducting contacts, wherein the forming of the channel provides a simultaneous self-aligned patterning of edges of the formed conducting contacts and the insulation stack; exposing the formed channel to an active material, wherein the active material is provided in operational association between the distinct conducting contacts; and setting the active material within the formed channel, between the conducting contacts.

Another aspect has the forming including cutting with a laser operating at predetermined wavelengths.

Another aspect includes wherein the cutting with the laser produces fine scale device features of less than 100 um.

Another aspect includes wherein the material of the substrate and insulation stack are non-absorbing in the wavelengths of the laser.

Another aspect includes wherein the self-aligned patterning of the edges of the conducting contacts and the insulation stack reduces a parasitic capacitance at a fringe of the edges of the conducting contacts and the insulation stack.

Another aspect includes wherein the forming of the channel is by a cutting operation achieved by use of a laser, and wherein the combination of the cutting operation, and a low surface energy of the hydrophobic layer of the insulating stack allows the active material to be dispersed from a surface of the hydrophobic layer.

Another aspect includes wherein the active material is aqueous or organic solvent based, having a viscosity such that it does not wet un-cut insulator stack areas.

Another aspect includes wherein the active material is one of a conducting and a semiconducting polymer.

Another aspect includes wherein the active material is exposed to the channel by a solution coating including but not limited to (i) dip-coating operations, (ii) printing drops, (iii) spin casting, (iv) wire bar coating, and (vi) by dragging the active material across the channel region to provide the active material in the channel.

Another aspect includes wherein the drops of active material exposed to the channel are at least one of dried in ambient conditions, dried by a baking step, and cross-linked by a photo-initiator.

Another aspect includes wherein the insulation layer of the insulation stack includes a known insulator, including but not limited to a spun-cast PVFD or vapor deposited Parylene C.

Another aspect includes wherein the hydrophobic layer is an insulating material that is capable of being cut.

Another aspect includes wherein a thickness of the active material in the channel depends on a volume of the confined or pinned drops and a concentration of the active material.

In another aspect an electronic device includes, a substrate having a first surface; a first conducting contact positioned on the first surface of the substrate; a second conducting contact positioned on the first surface of the substrate; an insulation stack, consisting of an insulation layer and a hydrophobic layer, the insulation stack in operational association with at least the first conducting contact and the second conducting contact; a channel positioned between the first conducting contact and the second conducting contact, wherein there is self-alignment between an first inner edge of the insulation stack and an inner edge of the first conducting contact and self-alignment between a second inner edge of the insulation stack an inner edge of the second conducting contact; and an active material located between and providing operational contact between the first conducting contact and the second conducting.

Another aspect includes first conducting contact being a source terminal; second conducting contact being a drain terminal; an electrolyte in operational contact with the active material within the channel; and a gate terminal located within an electrolyte.

Another aspect includes the device being an organic electrochemical transistor.

Another aspect includes the device being a two conducting contact device.

Another aspect includes the device being a three conducting contact device.

DETAILED DESCRIPTION

Figure 1:
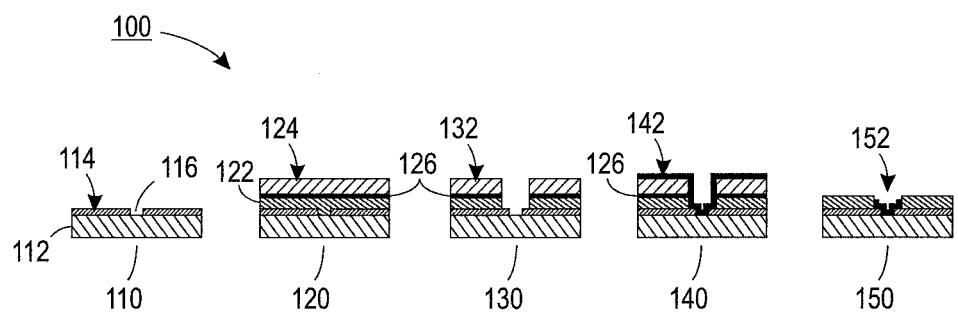
FIG. 1 depicts a device fabrication process.
Figure 2:
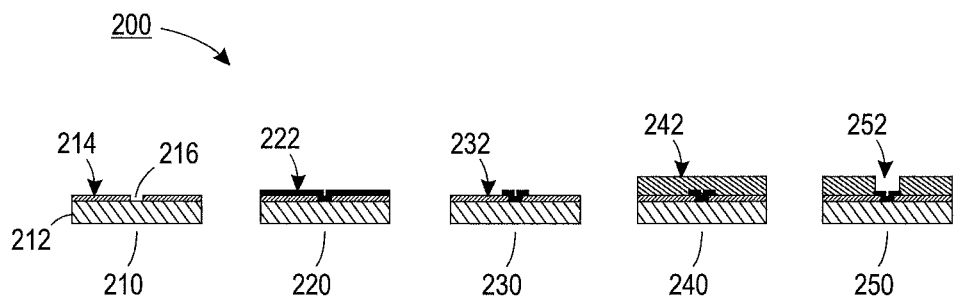
FIG. 2 depicts a device fabrication process.

Having considered the fabrication processes of FIGS. 1 and 2, the present disclosure now describes a new process for the fabrication of electronic devices having two or more conducting contacts (e.g., terminals). In the present fabrication process, a conducting interconnect line configured with a conductive material or layer, is coated with an insulation stack, where at least some portions of the insulation stack are functionalized to be hydrophobic (such as but not limited to a Polytetrafluoroethylene (PTFE), e.g., Teflon™). A cutting operation cuts through the conducting interconnect line and insulation stack. This cutting operation provides a simultaneous, one step, self-aligned patterning of conducting contacts formed by the cutting operation. More particularly, the self-aligned patterning, provides an alignment of edges of the formed conducting contacts and the insulation stack. Further, cutting of the conducting interconnect line and insulation stack, along with low surface energy of the insulating stack surface allows for an active channel material (e.g., active inks, etc.) to be deposited and confined in the channel, eliminating or minimizing active material being found on the surface of the insulation stack. A thickness of the active material in the channel depends on a volume of the drops and a concentration of the active material.

This fabrication process streamlines fabrication, i.e., there is no need to undertake multiple steps in order to pattern interconnects and conducting contacts (e.g., photolithographic related steps), and reduces and/or eliminates parasitic capacitance that occurs when prior processes are employed (e.g., see FIGS. 1 and 2).

The present disclosure has particular usefulness for, but is not limited to, electronic devices where bulk electronic transport governs the operation of the electronic devices, such as but not limited to: resistors, thermistors, chemiresistors, and transistors, such as electrochemical transistors (OECT), where porous, bulk chemical binding/reaction events are desirable. Additionally, in embodiments employing a laser for the cutting operation, the fine control achievable by laser cutting, and by selection of appropriate material allows the process described herein to be useful for surface sensitive applications such as field effect transistors. Thus the present disclosure teaches processing methods which provide self-alignment, further confining the device footprint, and simplifying fabrication.

Figure 3:
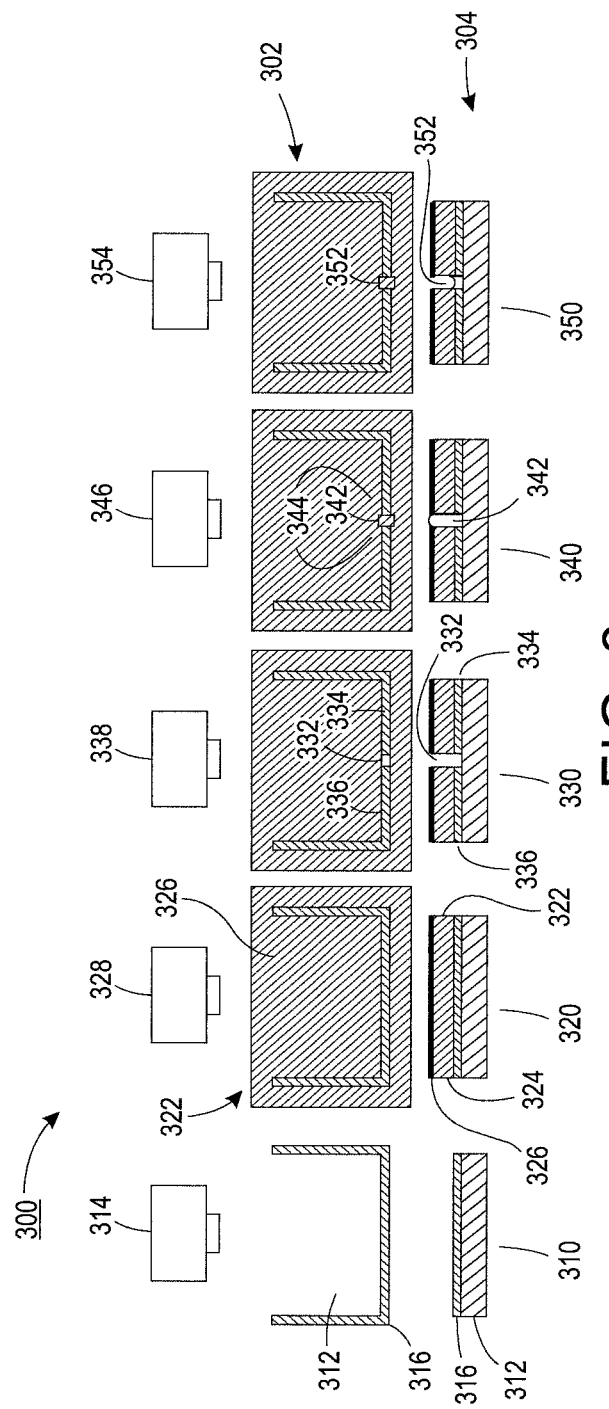
FIG. 3 depicts a device fabrication process according to the present disclosure.

Turning now to FIG. 3 fabrication process 300 according to the present concepts is illustrated by a series of top views 302 and side views 304. Initially, at step 310 a substrate 312 is provided. The substrate 312 can be one of a number of different substrate types, such as but not limited to a substrate made of a flexible material, polymeric material (such as Polyethylene terephthalate "PET"), and glass, among others. As part of step 310 a deposition or patterning system 314 deposits or patterns a conducting interconnect line (conductive material or layer) 316 onto a portion of the substrate 312. The deposition or patterning system 314 is a printing system, photolithographic system, or other appropriate system. Examples of the conducting interconnect line (conductive material or layer) 316, includes but is not limited a line formed by a printing operation using Ag ink, and photolithographic patterning using Au/Cr.

In step 320 the conducting interconnect line 316 (see step 310) is coated by an insulating stack arrangement 322, including an insulating layer (e.g., spun-cast PVDF, vapor deposited Parylene C, among others) 324, and a hydrophobic layer (e.g., such as but not limited to a thin layer of spun-cast Teflon) 326. The insulating stack arrangement 322 is formed by use of a coating system 328 configured to undertake the appropriate processing.

In a step 330 an opening is developed in the conducting interconnect line 316 and the insulator stack 322 (having an insulating layer 324 and a surface layer functionalized to be hydrophobic 326), defining a channel 332. The opening is achieved by a cutting operation which provides a simultaneous, one step, self-aligned patterning to form conducting contacts 334, 336. The cutting operation being implemented by cutting system 338, which in one embodiment is a laser (e.g., in an embodiment the laser cutting is accomplished using a laser in ambient temperature: coherent 3W, 266 nm diode pumped solid state laser).

In step 340, the channel 332 (see step 330) is exposed to an active material 342 (e.g., such as but not limited to an active ink, which may be aqueous or organic solvent based, of low enough viscosity, such that the active material does not wet un-cut insulator regions (including near or at the conductive material, e.g., 344). Providing the active material 342 is accomplished by use of an active material providing system 346 to provide solution coating, which includes but is not limited to dip-coating arrangements, liquid drop (printing) devices as well as systems where the active material is dragged across the channel region, pinning a drop or drops of the active solution into the channel 332. A thickness of the active material in the channel depends on a volume of the drops and a concentration of the active material.

The dip coating operation includes submersing the structure of the electronic device being fabricated into an active material solution and then removing the structure therefrom in a fashion that active material 342 is maintained within channel 332. Further, active material that may be on the surface is dispersed from the surface due to the hydrophobic nature of the surface. Similarly, for the alternative process of dragging active material across the channel region in order to provide the active material within the channel, active material that may come into contact with the hydrophobic surface will be dispersed from the hydrophobic surface. In still a similar way, when the exposing of the active material to the channel is by depositing or printing drop(s) into the channel and some active material inadvertently comes into contact with the hydrophobic surface, the hydrophobic surface will act to disperse the active material (also, in certain situations active material on the surface may be dispersed by entering into the channel). In each of these situations the provision of the hydrophobic surface acts to ensure that excessive amounts of the active material is not maintained on the structures surface, which would undesirably infer with operation of the electronic device being fabricated. What would be considered excessive will depend on a size of the cut (e.g., the well or channel). In certain embodiments it is greater than 2-5 times the volume of the well (depending on the roughness of the edges, which would act to pin more ink). The concept is to ensure the active material (e.g., ink) only goes in the well, without pinning more volume than will end up in the well.

Next in step 350 the active material 342 is acted upon to provide dried active material 352. Such drying can be accomplished by ambient drying. In other embodiments drying is accomplished during a bake step, or can be separately crosslinked by photo-initiator, such operations being accomplished by use of an appropriate active liquid setting/drying system 354 corresponding to the appropriate technique. In fabrication performed by the inventors, active inks have been dried at room temperature and with modest anneals <120 C, and in other testing the process has incorporated thermally activated crosslinking agents that react at moderate temperatures, where crosslinking operations are performed at 120-140 C, maximum.

A particular embodiment of the presently disclosed fabrication process employs a laser to perform the cutting operation. The use of a laser permits this type of cutting operation to be integrated in line with other depositing, printing, and patterning techniques of the process, allowing an automated or semi-automated assembly fabrication.

Using a laser to perform the cutting also permits fine scale device features to be patterned (approximately <100 um).

Additionally, in certain embodiments the materials used for the substrate and the insulating stack are selected to be outside the absorbing wavelengths of the laser, whereas the material selected for the conducting interconnect line (e.g., the conductive material) is chosen to be absorbing within the laser wavelengths. In still other embodiments the material used for the substrate is selected to be outside the absorbing wavelengths of the laser, whereas the materials of the insulation stack and the conducting interconnect line (conductive material) are chosen to be absorbing within the laser wavelengths.

When the materials used for the substrate and the insulating stack are outside the absorbing wavelengths of the laser, and the material selected as the conductive material is absorbing within the laser wavelengths certain beneficial aspects are obtained. Particularly, in an idealized situation when the substrate and the insulating stack material do not absorb the laser beam and only the conductive material absorbs the laser beam energy, the substrate is not affected (e.g., damaged by removal of material from the substrate by the laser beam). Further, the laser beam will pass through the insulating stack substantially unabsorbed. However, as the conductive material absorbs the laser energy this triggers ablation of the conductive material and as the conductive material is ablated (broken-up, etc.) the ablated conductive material breaks though the insulation layer (i.e., as it is extremely thin) at locations substantially corresponding specifically to the area of the conductive material being ablated. This operation causes the self-alignment of the insulation stack and the conductive material, as illustrated in FIG. 3.

However, in experiments some laser energy can be absorbed by the substrate material, however in this situation the energy produced by the laser is controlled to limit the amount of material of the substrate that is removed to an acceptable amount, allowing proper intended operation of the electronic device being fabricated.

In situations where the materials for the insulation stack and the conductive material are selected to be in the absorbing range of the laser, in an idealized situation only the conductive material and the corresponding insulation stack is ablated, while the substrate remains unaffected. However, similar to the previous discussion, when implemented in experiments some laser energy can be absorbed by the substrate material, however in this situation the energy produced by the laser is controlled to limit the amount of material of the substrate that is removed to an acceptable amount, allowing proper intended operation of the electronic device being fabricated.

Further, a raster laser scan across the conducting interconnect (uncut) line 316 will substantially only ablate/eject material on/at the relevant portion of the conducting interconnect line 316, leading to a self-aligned opening that defines the channel width (See FIG. 3, bottom). The width is defined in certain embodiments by the conducting trace (e.g., limited by printing resolution to 5 um to >mm range) but the width can also be obtained by patterned photolithographically to be smaller. Length of channel is defined by the resolution of the cutting tool, such as to a mentioned 100 um, this stated length is limited by the cutting technology employed. Depth is limited by the thickness of the insulating stack and the amount of undercut on the substrate which is variable, but controllable from 10's of nanometers to a mm in certain embodiments.

OECT Embodiment

Figure 4:
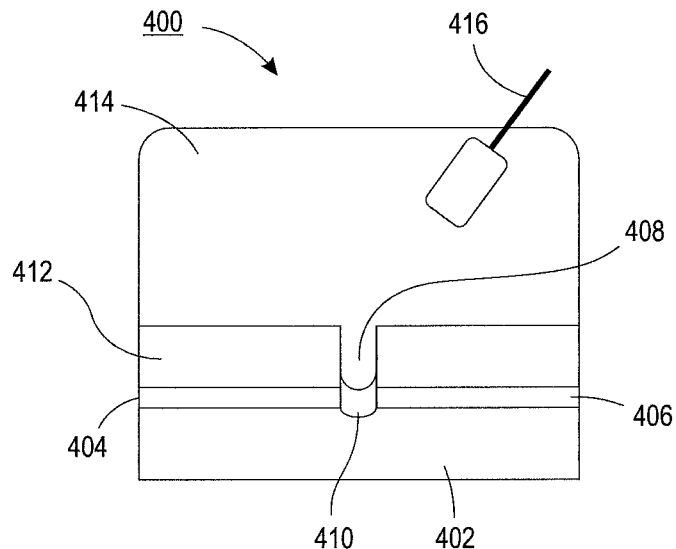
FIG. 4 depicts a OECT fabricated according to the present concepts.

Turning attention to FIG. 4, illustrated is an organic electrochemical transistor 400 configured according to the fabrication process set forth herein. Such organic electrochemical transistors (OECTs) 400, are electrolyte gated transistors that comprise a substrate (flexible or non-flexible) 402, on which are source electrode 404 and drain electrode 406, separated by a channel 408, within which is an active channel material (conducting/semiconducting, polymer, etc.) 410. This configuration is insulated (or passivated) by insulation stack (having an insulating layer and a hydrophobic layer/surface as previously described, e.g., including but not limited to PVDF/Teflon, PaC/Teflon, etc.) 412. The OECT structure 400 further includes an electrolyte or ion rich medium 414, and a gate electrode 416 within the medium 414. In certain embodiments the gate 416 is, but is not limited to, an Ag/AgCl, large delocalized gate or on board planar gate. Conductance of the active channel material 408 is modulated by electrochemical doping or de-doping of the (conducting, semi-conducting, polymeric) channel 408.410 on application of a gate bias to high capacitance gate electrode (e.g., Ag/AgCl) 416 immersed in electrolyte medium 416. The device contacts and interconnects are passivated from the aqueous environment using insulating stack/layer 412. The capability of these devices to allow for facile ion interaction with the bulk of the active polymer (often a conducting polymer such as PEDOT:PSS) means these devices offer high trans-conductance, useful for bio-sensing and electrophysiological recordings, among many other uses. The response time for such devices scaling with the RC charging time of the channel, therefore roughly corresponding with the volume of the channel. Thus this includes, but is not necessarily just related to the channel length, of the device (e.g., transistors, etc.). Particularly, faster response time equals smaller channel volume the transistor. Thus, sufficiently fast devices with high recording density employ micron scale dimensions (1-100 um). As the features of the present process, including the self-alignment permit smaller more compact channels which are conducive to the above. It is mentioned here that transconductance is known to scale as Wd/L.

The channel 408 of OECT 400 has been formed using the laser cutting fabrication method previously described. In certain embodiments the active channel material 410 is either PEDOT:PSS (PJet 700) with epoxy silane cross-linker (aqueous ink dispersion), or p(g2T-TT) (chloroform ink).

Figure 5:
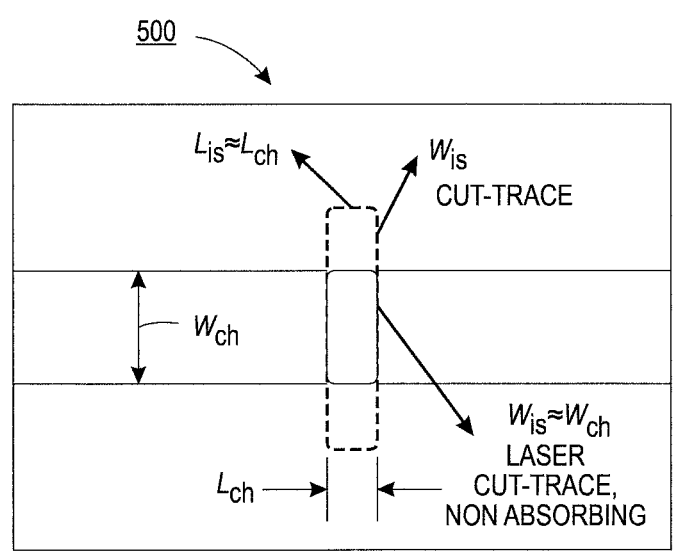
FIG. 5 depicts a top view of a device being fabricated according to the present concepts.

Turning to a top view 500 of FIG. 5, illustrated are alternative aspects for the process discussed in connection with FIG. 3, in situations where (i) the materials chosen for the insulating stack and conductive material absorb, and the material for the substrate does not absorb at the laser wavelengths; and the alternative situation where (ii) the material chosen for the conductive material absorbs and the materials chosen for the insulating stack and substrate do not absorb at the laser wavelengths.

The channel width (Wch) is defined by the line width of the conducting line (material, interconnecting line). The channel length is defined by the cutting procedure (Lch). The opening in the insulator is defined by the same cutting procedure (self-aligned to channel length such that Lch~Lis (island length)), and the width of the opening is defined by the length of the cutting trace (Wis (island width)). In the case of the laser cutting with non-absorbing substrate and insulator stack, as described above, the insulator opening width (Wis) can be self-aligned with the width of the conducting trace (defining Wch), thus Wis~Wch. This reduces the parasitic capacitance at the fringe of the device which would otherwise slow device performance. In this self-alignment situation, the area of electrical contact is limited to the cross-sectional area of the conducting trace. The thickness of channel material depends on the volume of the pinned droplet(s) and its/their concentration.

In situations where the substrate is non-absorbing and the insulating stack and conductive line are absorbing a self-alignment between the conductive line (material) and the insulator stack over that area is maintained, the cutting of the insulator stack can extend as shown by the dotted line portions. This creates a extend exposure of the substrate, which may increase parasitic capacitance as opposed to the previous example.

Figure 6:
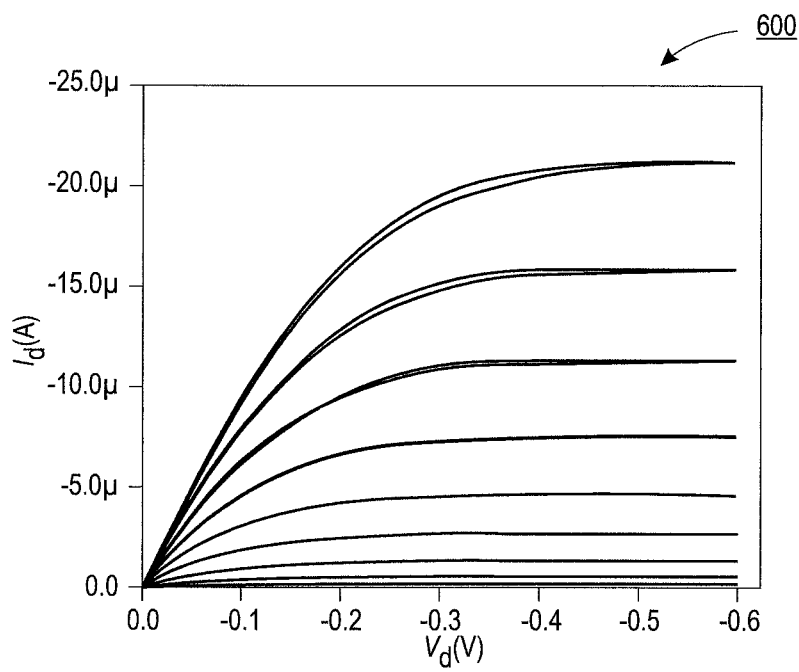
FIG. 6 is a chart.
Figure 7:
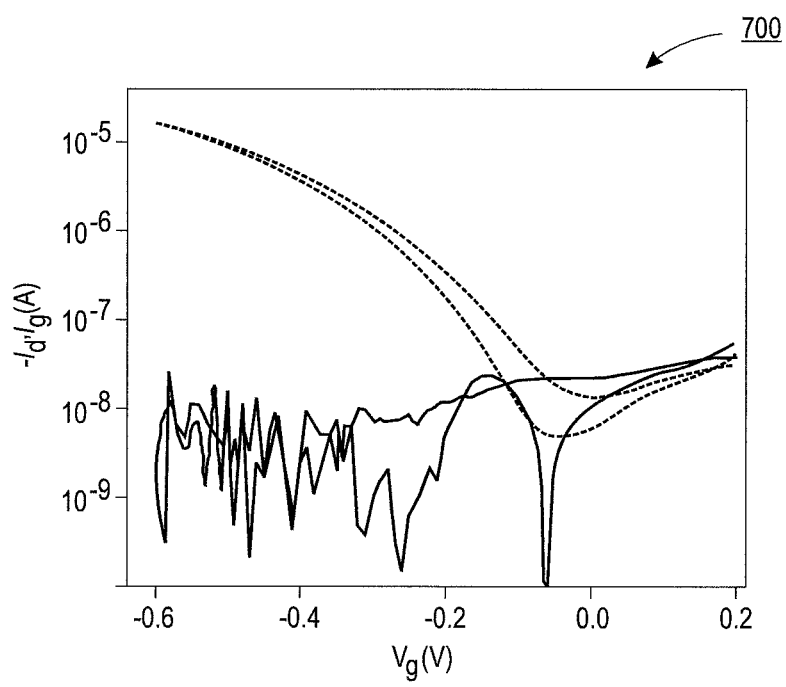
FIG. 7 is a chart.

FIG. 6 is a chart 600 showing operating characteristics in the form of output curves, and FIG. 7 is a chart 700 showing operating characteristics in the form of transfer curves. The charts are for a working p(g2T-TT) OECT designed according to the present disclosure, which includes laser-cut Au/PaC+Teflon stack, operated in 0.1M NaCl with Ag/AgCl gate electrode (or contact). W~500 um, L~30 um, depicting drain current, and gate current.

The output curves of FIG. 6 show drain current vs. drain voltage characteristics of the device. The drain current is swept from 0 V to −0.6 V and back to zero, while the gate voltage was stepped from 0V to −0.6V in steps of −0.05V.

FIG. 7 shows transfer characteristics: drain current and gate current vs. gate voltage. The drain voltage is kept constant at −0.6V, while the gate voltage is swept from 0.2V to −0.6V and back while recording both drain current and gate current.

For both FIGURES, the devices are measured with 2 source measure units (NI PXIe).

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of manufacturing an electronic device comprising:
   providing a substrate;
   depositing a conductive material on at least a portion of the substrate, to form a conducting interconnect line;
   coating at least the conducting interconnect line of the deposited conductive material with an insulation stack, wherein the insulation stack consists of an insulation layer and a hydrophobic layer;
   in a single operational step, forming a channel in the insulation stack and the conducting interconnect line to form distinct conducting contacts, wherein the forming of the channel provides a simultaneous self-aligned patterning of edges of the formed conducting contacts and the insulation stack;
   exposing the formed channel to an active material, wherein the active material is provided in operational association between the distinct conducting contacts; and
   setting the active material within the formed channel, between the conducting contacts.

2. The method according to claim 1 wherein the forming includes cutting with a laser operating at predetermined wavelengths.

3. The method according to claim 2 wherein the cutting with the laser produces fine scale device features of less than 100 um.

4. The method according to claim 2 wherein the material of the substrate and insulation stack are non-absorbing in the wavelengths of the laser.

5. The method according to claim 4 wherein the self-aligned patterning of the edges of the conducting contacts and the insulation stack reduces a parasitic capacitance at a fringe of the edges of the conducting contacts and the insulation stack.

6. The method according to claim 1 wherein the forming of the channel is by a cutting operation achieved by use of a laser, and wherein the combination of the cutting operation, and a low surface energy of the hydrophobic layer of the insulating stack allows the active material to be dispersed from a surface of the hydrophobic layer.

7. The method according to claim 1 wherein the active material is aqueous or organic solvent based, having a viscosity such that it does not wet un-cut insulator stack areas.

8. The method according to claim 1 wherein the active material is one of a conducting and a semiconducting polymer.

9. The method according to claim 1 wherein the active material is exposed to the channel by solution coating.

10. The method according to claim 1 wherein drops of active material exposed to the channel are at least one of dried in ambient conditions, dried by a baking step, and cross-linked by a photo-initiator.

11. The method according to claim 1 wherein the insulation layer of the insulation stack includes a known insulator.

12. The method according to claim 1 wherein the hydrophobic layer is configured of an insulating material capable of being cut.

13. The method according to claim 1 wherein a thickness of the active material in the channel depends on confined or pinned drops and a concentration of the active material.

14. An electronic device comprising:
a substrate having a first surface;
a first conducting contact positioned on the first surface of the substrate;
a second conducting contact positioned on the first surface of the substrate;
an insulation stack, consisting of an insulation layer and a hydrophobic layer, the insulation stack in operational association with at least the first conducting contact and the second conducting contact;
a channel, which was formed by a single operational step, positioned between the first conducting contact and the second conducting contact, wherein there is self-alignment between a first inner edge of the insulation stack and an inner edge of the first conducting contact and self-alignment between a second inner edge of the insulation stack and an inner edge of the second conducting contact; and
an active material located between and providing operational contact between the first conducting contact and the second conducting contact.

15. The device of claim 14 further including:
the first conducting contact being a source;
the second conducting contact being a drain;
an electrolyte in operational contact with the active material within the channel; and
a gate located within an electrolyte.

16. The device of claim 15 being an organic electrochemical transistor.

17. The device of claim 14 being a two conducting contact device.

18. The device of claim 17 being a three conducting contact device.

* * * * *